United States Patent [19]

Abe

[11] 3,880,684

[45] Apr. 29, 1975

[54] PROCESS FOR PREPARING SEMICONDUCTOR

[75] Inventor: Haruhiko Abe, Takarazuka, Japan

[73] Assignee: Mitsubishi Denki Kabushiki Kaisha, Tokyo, Japan

[22] Filed: Aug. 3, 1973

[21] Appl. No.: 385,273

[52] U.S. Cl. ...................... 156/8; 156/17; 252/79.1
[51] Int. Cl. .............................................. H01l 7/50
[58] Field of Search ...................... 156/3, 8, 11, 17; 252/79.1, 79.4; 204/129.1; 317/235

[56] References Cited

UNITED STATES PATENTS

| | | | |
|---|---|---|---|
| 3,615,956 | 10/1971 | Irving | 156/17 |
| 3,635,774 | 1/1972 | Masaya Ohta | 156/17 |
| 3,795,557 | 3/1974 | Jacob | 156/8 |

*Primary Examiner*—William A. Powell
*Attorney, Agent, or Firm*—Oblon, Fisher, Spivak, McClelland & Maier

[57] ABSTRACT

A semiconductor is prepared by continuously etching at least two types of silicon compound membranes such as silicon dioxide ($SiO_2$), silicon nitride ($Si_3N_4$) or a polycrystalline silicon membrane which are formed on a silicon substrate. A freon gas plasma is used for etching so that the two types of silicon compound membranes are continuously etched in a sloped form without any undercutting, as occurs in conventional chemical solution etching.

9 Claims, 8 Drawing Figures

PROCESS FOR PREPARING SEMICONDUCTOR

BACKGROUND OF THE INVENTION

1. Field of the Invention

This invention relates to a process for preparing a semiconductor, and especially to a process for preparing a semiconductor by etching at least two types of silicon compound membranes or layers formed on a silicon substrate using a freon gas plasma.

2. Description of the Prior Art

Heretofore, etching of silicon dioxide ($SiO_2$), silicon nitride ($Si_3N_4$) or polycrystalline silicon membranes has been selectively performed by using a etching agent such as hydrofluoric acid, phosphoric acid, etc..

The conventional etching method using an etching solution for etching two types of silicon compound membranes such as silicon dioxide, silicon nitride or polycrystalline silicon membranes formed on a silicon substrate will now be described in more detail.

As shown in FIG. 1, a silicon dioxide membrane or layer 2 is formed on a silicon substrate 1 and then silicon nitride membrane or layer of predetermined thickness 3 is formed on it by a vapor phase reaction.

In order to etch the silicon nitride membrane 3 with phosphoric acid, a protecting surface formed of a silicon dioxide membrane or layer 4 is selectively coated on the silicon nitride membrane 3. The coated product is immersed in phosphoric acid solution for a predetermined time to locally remove the silicon nitride membrane 3. In order to remove the segment 5 of the silicon dioxide membrane 2 designated by cross hatched lines the product is immersed in hydrofluoric acid. At this time, only the silicon dioxide membrane 2 under the silicon nitride membrane 3 is etched and is removed, as shown in FIG. 3, causing the so called undercutting phenomenon to occur. When electrode wiring (usually using an aluminum membrane or layer) is provided on the structure, normal operation of the element is impossible because of disconnection caused by the undercutting. It is therefore quite an important problem in manufacturing semiconductor integrated circuits to overcome the disconnection problem caused by the undercutting.

SUMMARY OF THE INVENTION

Accordingly, it is an object of this invention to provide a process for preparing a semiconductor by sloped etching of at least two types silicon compound membranes formed on a silicon substrate with freon gas plasma using freon or a mixture of freon and an inert gas.

It is another object of this invention to provide a process for sloped etching at least two types compound membranes formed of silicon dioxide, silicon nitride or a polycrystalline silicon membrane formed on a silicon substrate.

It is another object of this invention to provide a process for sloped etching at least two types of silicon compound membranes formed on a silicon substrate with a mixed gas plasma including freon gas and argon gas as an inert gas.

It is still another object of this invention to provide a process for effective sloped etching by using freon gas or a mixture of freon gas and an inert gas having a gas pressure of from 0.3 – 0.8 Torr

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 4:
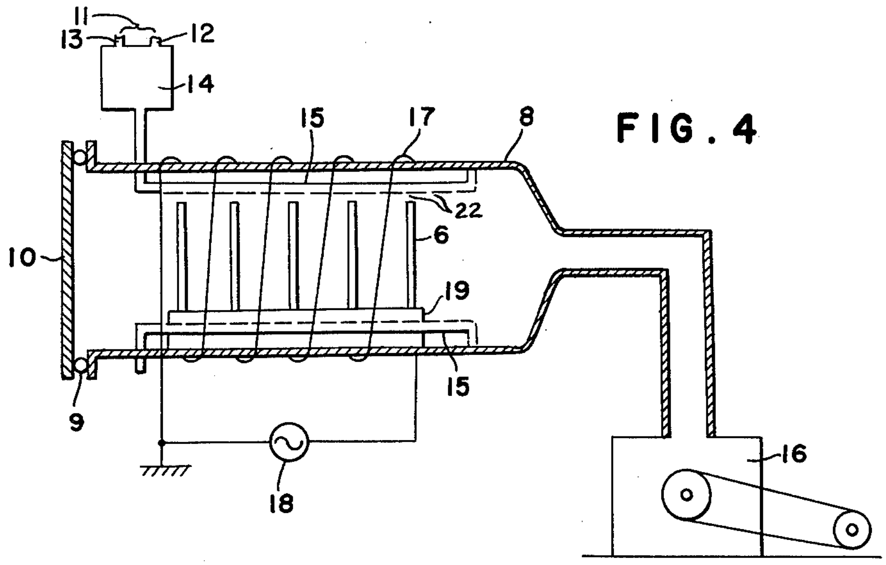
FIG. 4 is a schematic view of an apparatus for forming plasma according to this invention.
Figure 5:
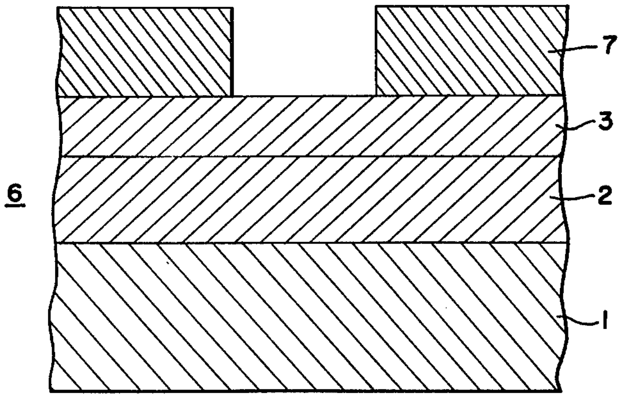
FIG. 5 is a sectional view of one embodiment of a semiconductor element for illustrating the process of one embodiment of this invention.
Figure 6:
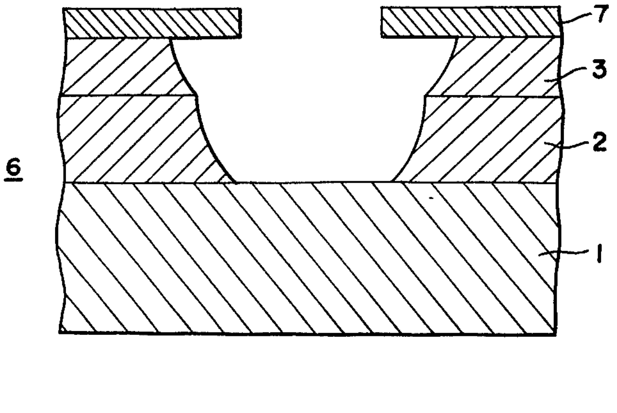
FIG. 6 is a sectional view of a semiconductor element which is formed by etching the element of FIG. 5.

Referring now to the drawings, wherein like reference numerals designate identical or corresponding parts throughout the several views, and more particularly to FIGS. 4, 5 and 6 thereof, one embodiment of the process of this invention is illustrated.

FIG. 5 is a sectional view of a semiconductor element which is to be plasma-etched and which comprises a silicon substrate 1, a silicon dioxide membrane or layer 2, a silicon nitride membrane or layer 3, and a resist membrane or layer 7 formed either of an aluminum layer or a photoresist membrane.

If a photoresist membrane 7 is employed it is optimum to use a photoresist containing no inorganic impurity, such as Waycoat I.C. resist (trade name) manufactured by Hunt Chemical Co., ltd. or OMR-83 (trade name) manufactured by Tokyo Oka Kogyo. It is also noted that freon is a fluorohydrocarbon or fluorochloro hydrocarbon such as $CHClF_2$, $CCl_2F_2$, $CCl_2F$, $CClF_2$, $CF_4$, $C_2F_6$, etc. The semiconductor element 6 of FIG. 5 is inserted in the apparatus of FIG. 4 for forming plasma, so as to perform the etching.

Referring now to FIG. 4, the plasma forming apparatus is illustrated as comprising a plasma originating tube 8 made of quartz; a silicon rubber O-ring 9 for vacuum maintenance; a cap 10 made of quartz; and a gas feed line 11 including a freon gas pipe 12 and an inert gas pipe 13; and a gas mixer 14 for mixing freon gas with the inert gas, which may be argon for example.

The etching speed can be controlled and the corrosion resistance of the photoresist membrane 7 can also be increased by adjusting the ratio of inert gas to freon gas. However, it is not always necessary to mix the inert gas with the freom gas. Four gas inlet pipes 15 are arranged with equal angle and equal spacing and are elongated along the inner wall of the plasma discharge tube 8 and a plurality of gas injection nozzles 22 are formed on each gas inlet pipe 15 so to supply the gas mixture in the plasma originating tube 8. A vacuum pump 16 is provided for exhausting the plasma discharge tube 8. An electrode 17 for applying high frequency power is wound on the outer surface of the plasma discharge tube 8 in spiral form and high frequency power is supplied from a high frequency oscillator 18, which preferably supplies power having a frequency of 13.56 $MH_Z$ although frequencies in the range of 5 – 50 $MH_Z$ may be used and at a rate of from several tens to several hundreds watts.

A quartz boat 19 is placed in the plasma discharge tube 8 and a plurality of the semiconductor elements 6 are placed on the boat 19.

In the step of etching the semiconductor element 6 shown in FIG. 5, the semiconductor element 6 is placed on the boat 19 and is inserted in the plasma discharge tube 8. The space between the semiconductor elements 6 is preferably made from 5 – 15 mm for etching efficiency and economical treatment. After inserting the semiconductor elements 6 in the tube 8, the cap 10 is closed and the vacuum pump 16 is activated to exhaust air from the tube 8 to keep the pressure of the tube at lower than $10^{-2}$ Torr.

After reducing the pressure of the remaining gas in the tube 8 to a predetermined pressure, freon gas and the inert gas, such as argon, are fed through the gas feed line 11 to the gas mixer 14 to form a gas mixture having a predetermined ratio of partial pressures, and the gas mixture is fed into the tube 8 at a constant rate.

In order to maintain the stability of the etching effect and the electrical characteristics of the semiconductor, it is especially preferable to keep the gas pressure between 0.3 – 0.8 Torr. in the tube 8. The flow rate of the gas mixture is preferably from 10 – 500 cc/min., and ideally 100 cc/min.

Then, the high frequency oscillator 18 is actuated to apply a constant high frequency power to the electrode 17 and to form plasma so that the semiconductor elements 6 are immersed in the plasma for a predetermined time. If 24 of the elements 6 are placed in the tube, the elements are immersed in the plasma for about 20 minutes.

FIG. 6 shows a sectional view of the layered structure of silicon nitride membrane 3 and a silicon dioxide membrane 2 which are etched as described above.

As is clear from FIG. 6, the double membranes are slope etched by the plasma etching method.

The sloped etching was confirmed by the conventional slow electron method (SEM method).

The sloped etching is formed by the plasma etching, because the rate of etching the silicon nitride membrane in the gas plasma is higher than the rate of etching the silicon dioxide membrane 2. For example, when the gas pressure of freon gas in the tube 8 is 0.5 Torr. and the applied high frequency power is 400 watts, the etching coefficient of the silicon nitride membrane 3 is about 500 A/min. Similarly, the etching coefficient of the polycrystalline silicon membrane is about 1000 A/-min.

Figure 1:
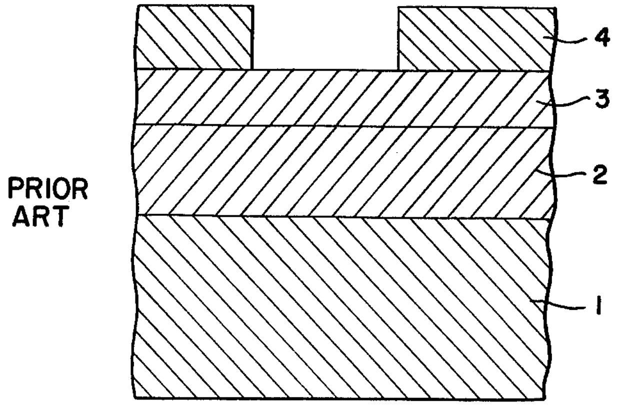
FIG. 1 is a sectional view of a conventional semiconductor element having a silicon dioxide membrane, a silicon nitride membrane and a resist membrane which will be etched.
Figure 2:
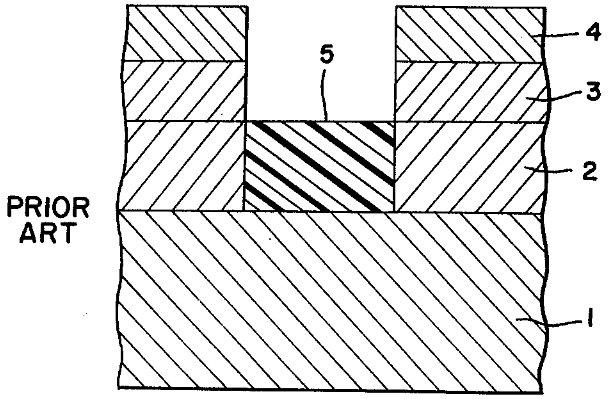
FIG. 2 is a sectional view of the conventional semiconductor element from which the silicon nitride membrane of FIG. 1 is partially removed.
Figure 3:
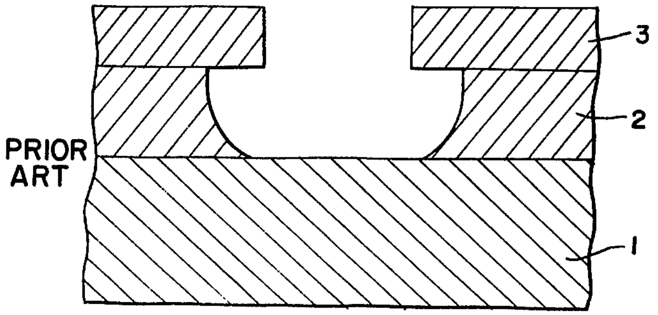
FIG. 3 is a sectional view of the conventional semiconductor element showing an undercut silicon dioxide membrane caused by etching the element of FIG. 2.

In general, the ratio of the etching coefficient of the silicon nitride membrane with respect to the etching coefficient of the silicon dioxide membrane is about 2 to 3 in the plasma. Accordingly, when the silicon dioxide membrane 2 on the silicon substrate 1 is etched, the silicon nitride membrane 3 on the silicon dioxide membrane 2 is simultaneously etched so that no undercutting of the type caused in the conventional etching techniques using a chemical etching solution as shown in FIG. 3 is produced.

After completing the etching by the freon gas plasma, the corrosion resist membrane 7 is removed. Removal of the corrosion resist membrane 7 can be attained by the use of conventional chemical solutions. However, it is also possible to remove the corrosion resist membrane 7 by an oxygen gas plasma formed by the plasma originating apparatus of FIG. 5. In the step of removing the corrosion resist membrane 7 by an oxygen gas plasma, it is optimum to supply oxygen gas at a rate of from 500 – 2000 cc/min. (preferably 1000 cc/min.) under a pressure of 1 – 5 Torr. Simultaneously high frequency power is supplied by the high frequency oscillator 18 at a rate of from 300 – 400 watts.

Figure 7:
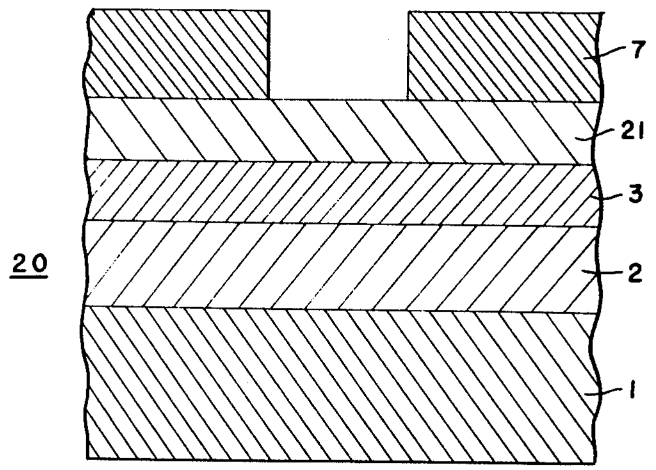
FIG. 7 is a sectional view of another embodiment of semiconductor element of this invention.
Figure 8:
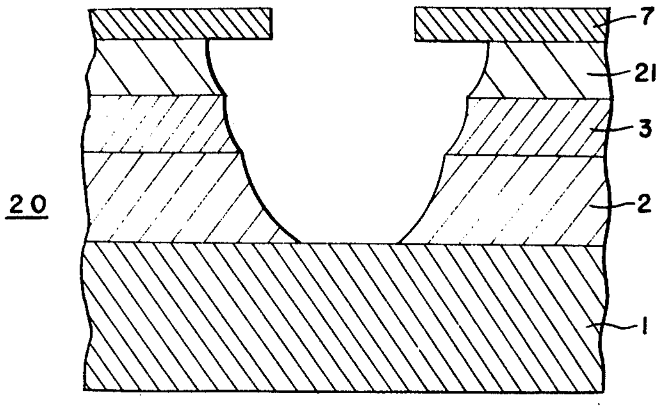
FIG. 8 is a sectional view of a semiconductor element which is formed by etching the element of FIG. 7.

Referring to FIGS. 7 and 8, other embodiments of the process of this invention are illustrated.

In the semiconductor element 20 of FIG. 7, a polysilicon membrane 21 is formed on the silicon nitride membrane 3 of FIG. 5, and the corrosion resist membrane 7 is formed on the polysilicon membrane 21. That is, three layers of silicon compound membranes are formed on the silicon substrate 1. The semiconductor elements 20 are inserted into the plasma originating apparatus of FIG. 5, so that plasma etching is performed to result in a slant-etching of the three layered structure including the polysilicon membrane 21, the silicon nitride membrane 3 and the silicon dioxide membrane 2.

Obviously, numerous additional modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A process for preparing a semiconductor comprising a base layer, a first silicon compound membrane having a first etching coefficient formed on the base layer and a second silicon compound membrane having a second etching coefficient lower than the first etching coefficient formed on the first silicon compound membrane comprise the steps of slope etching to a first extent the first silicon compound membrane having a first etching coefficient using a fluorohydrocarbon or fluorochloro hydrocarbon gas plasma and slope etching to a second extent greater than the first extent the second silicon compound membrane have a second etching coefficient lower than the first etching coefficient using the same fluorohydrocarbon or fluorochloro hydrocarbon gas plasma whereby undercutting is prevented.

2. A process for preparing a semiconductor in accordance with claim 1 wherein the first silicon compound is $SiO_2$ and the second silicon compound is $Si_3N_4$.

3. A process for preparing a semiconductor in accordance with claim 1 wherein a polysilicon membrane is formed on the second silicon compound membrane and wherein the polysilicon membrane is slope etched to a third extent greater than the second extent by the same fluorohydrocarbon or fluorochloro hydrocarbon gas plasma.

4. A process for preparing a semiconductor in accordance with claim 1 wherein a corrosion resist membrane disposed on the semiconductor is removed by oxygen gas plasma formed in the chamber.

5. A process for preparing a semiconductor in accordance with claim 1 wherein fluorohydrocarbon or fluorochloro hydrocarbon gas plasma is formed by supplyig a mixture of fluorohydrocarbon or fluorochloro hydrocarbon and an inert gas to an evacuated chamber and applying high frequency power to an electrode wound about the chamber.

6. A process for preparing a semiconductor in accordance with claim 5 wherein the mixture of fluorohydrocarbon or fluorochloro hydrocarbon and inert gas is supplied to the chamber at the rate of 10–500 cubic centimeters per minute.

7. A process for preparing a semiconductor in accordance with claim 1 wherein the fluorohydrocarbon or fluorochloro hydrocarbon gas plasma is formed by mixing an inert gas with fluorohydrocarbon or fluorochloro hydrocarbon gas prior to etching.

8. A process for preparing a semiconductor in accordance with claim 7 wherein the speed of etching is controlled by varying the ratio of inert gas to fluorohydrocarbon or fluorochloro hydrocarbon gas.

9. A process for preparing a semiconductor in accordance with claim 7 wherein the etching is performed at a pressure of 0.3 to 0.8 Torr.

* * * * *